US011916082B2

United States Patent
Zhao et al.

(10) Patent No.: US 11,916,082 B2
(45) Date of Patent: Feb. 27, 2024

(54) ARRAY SUBSTRATE, MANUFACTURING METHOD THEREOF, AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Huihui Zhao, Wuhan (CN); Changbum Park, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 540 days.

(21) Appl. No.: 17/263,150

(22) PCT Filed: Nov. 26, 2020

(86) PCT No.: PCT/CN2020/131614
§ 371 (c)(1),
(2) Date: Jan. 25, 2021

(87) PCT Pub. No.: WO2022/077714
PCT Pub. Date: Apr. 21, 2022

(65) Prior Publication Data
US 2022/0375965 A1  Nov. 24, 2022

(30) Foreign Application Priority Data
Oct. 13, 2020 (CN) .......................... 202011091711.6

(51) Int. Cl.
*H01L 27/12* (2006.01)

(52) U.S. Cl.
CPC .......... *H01L 27/124* (2013.01); *H01L 27/127* (2013.01); *H01L 27/1225* (2013.01);
(Continued)

(58) Field of Classification Search
CPC ......................... H01L 27/124; H01L 27/1244
See application file for complete search history.

(56) References Cited

U.S. PATENT DOCUMENTS

| 2019/0259967 | A1  | 8/2019 | Weiwei |
| 2019/0288048 | A1* | 9/2019 | Kang ................... G09G 3/3233 |

(Continued)

FOREIGN PATENT DOCUMENTS

| CN | 107994055 A * | 5/2018 | ......... H10K 59/1201 |
| CN | 107994055 A   | 5/2018 | |

(Continued)

OTHER PUBLICATIONS

Machine translation, Bai, Chinese Pat. Pub. No. CN109560087A, translation date: Aug. 4, 2023, Espacenet, all pages. (Year: 2023).*

(Continued)

*Primary Examiner* — Victoria K. Hall
(74) *Attorney, Agent, or Firm* — PV IP PC; Wei Te Chung; Zhigang Ma

(57) ABSTRACT

An array substrate, a manufacturing method thereof, and a display panel are provided. The array substrate includes a bending area and a non-bending area, and further includes an inorganic stacked layer disposed on a substrate layer. A recess is formed on the inorganic stacked layer in the bending area. A plurality of first metal lines are disposed in the inorganic stacked layer at two sides of the bending area. A filling layer is filled in the recess. The array substrate further includes a second metal line disposed on the inor- (Continued)

ganic stacked layer and the filling layer, and the first metal lines at the two sides of the bending area form a lap joint by the second metal line.

4 Claims, 6 Drawing Sheets

(52) U.S. Cl.
CPC ...... *H01L 27/1229* (2013.01); *H01L 27/1248* (2013.01); *H01L 27/1251* (2013.01)

(56) References Cited

U.S. PATENT DOCUMENTS

| | | | |
|---|---|---|---|
| 2020/0357829 A1* | 11/2020 | Yang | H01L 27/1225 |
| 2021/0005693 A1* | 1/2021 | Cho | H10K 59/1201 |

FOREIGN PATENT DOCUMENTS

| | | | | | |
|---|---|---|---|---|---|
| CN | 108008866 | A | | 5/2018 | |
| CN | 108962946 | A | | 12/2018 | |
| CN | 109205997 | A | * | 1/2019 | ........... C03B 17/064 |
| CN | 109205997 | A | | 1/2019 | |
| CN | 109256045 | A | | 1/2019 | |
| CN | 109560087 | A | | 4/2019 | |
| CN | 109560087 | A | * | 4/2019 | ........... H01L 27/124 |
| CN | 109599419 | A | | 4/2019 | |
| CN | 109638021 | A | * | 4/2019 | ............ C23C 14/04 |
| CN | 109638021 | A | | 4/2019 | |
| CN | 109671761 | A | | 4/2019 | |
| CN | 110034126 | A | | 7/2019 | |
| CN | 110277427 | A | | 9/2019 | |
| CN | 110429116 | A | | 11/2019 | |
| CN | 110581140 | A | | 12/2019 | |
| CN | 110690224 | A | | 1/2020 | |
| CN | 111430417 | A | | 7/2020 | |
| CN | 111430417 | A | * | 7/2020 | ......... H01L 27/1244 |
| CN | 111564458 | A | * | 8/2020 | ......... H01L 27/1222 |
| CN | 111564458 | A | | 8/2020 | |
| WO | 2020124921 | A1 | | 6/2020 | |

OTHER PUBLICATIONS

Machine translation, Bu, Chinese Pat. Pub. No. CN107994055A, translation date: Aug. 4, 2023, Espacenet, all pages. (Year: 2023).*
Machine translation, Morimoto, Chinese Pat. Pub. No. CN109205997A, translation date: Aug. 4, 2023, Espacenet, all pages. (Year: 2023).*
Machine translation, Yang, Chinese Pat. Pub. No. CN111430417A, translation date: Aug. 4, 2023, Espacenet, all pages. (Year: 2023).*
Machine translation, Zhang, Chinese Pat. Pub. No. CN109638021A, translation date: Aug. 4, 2023, Espacenet, all pages. (Year: 2023).*
Machine translation, Zhao, Chinese Pat. Pub. No. CN111564458A, translation date: Aug. 4, 2023, Espacenet, all pages. (Year: 2023).*
Translation, Written Opinion of the International Searching Authority, International Searching Authority, International application No. PCT/CN2020/131614, dated Jul. 9, 2021, all pages. (Year: 2021).*
Translation, International Search Report, International Searching Authority, International application No. PCT/CN2020/131614, dated Jul. 9, 2021, all pages. (Year: 2021).*
International Search Report in International application No. PCT/CN2020/131614, dated Jul. 9, 2021.
Written Opinion of the International Search Authority in International application No. PCT/CN2020/131614, dated Jul. 9, 2021.
Chinese Office Action issued in corresponding Chinese Patent Application No. 202011091711.6 dated May 30, 2022, pp. 1-10.

* cited by examiner

```
┌─────────────────────────────────────────┐
│ Forming an inorganic stacked layer and a plurality of   │
│ first metal lines on a substrate layer, wherein the     │
│ substrate layer includes a bending area and a non-      │──S1
│ bending area, the first metal lines are disposed in the │
│ non-bending area at two sides of the bending area and   │
│ are embedded in the inorganic stacked layer.            │
└─────────────────────────────────────────┘
                      │
                      ▼
┌─────────────────────────────────────────┐
│ Patterning the inorganic stacked layer to form a recess │──S2
│ in the bending area and form a plurality of openings    │
│ corresponding to the first metal lines.                 │
└─────────────────────────────────────────┘
                      │
                      ▼
┌─────────────────────────────────────────┐──S3
│ Filling the recess with a filling layer.                │
└─────────────────────────────────────────┘
                      │
                      ▼
┌─────────────────────────────────────────┐
│ Forming a source/drain metal layer on the inorganic     │
│ layer and the filling layer, and patterning the         │──S4
│ source/drain metal layer to form a second metal line in │
│ the bending area, wherein the second metal line and     │
│ the first metal lines disposed at two sides of the      │
│ bending area form a lap joint by the openings.          │
└─────────────────────────────────────────┘
```

FIG. 1

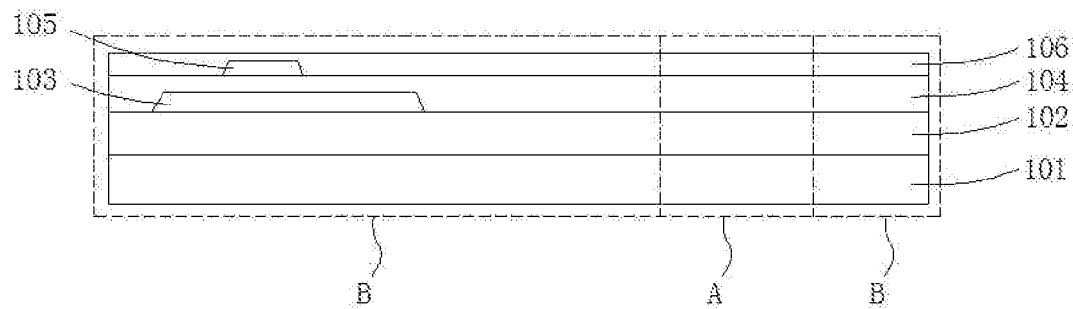

FIG. 2

ARRAY SUBSTRATE, MANUFACTURING METHOD THEREOF, AND DISPLAY PANEL

This application is a National Phase of PCT Patent Application No. PCT/CN2020/131614 having international filing date of Nov. 26, 2020, which claims the benefit of priority of Chinese Patent Application No. 202011091711.6 filed on Oct. 13, 2020. The contents of the above applications are all incorporated by reference as if fully set forth herein in their entirety.

FIELD

The present disclosure relates to the field of display technologies, and more particularly, relates to an array substrate, a manufacturing method thereof, and a display panel.

BACKGROUND

Low-temperature polycrystalline oxides (LTPOs) allows organic light-emitting diode (OLED) display technologies to consume lower power. Compared with low-temperature polysilicon thin-film transistors (LTPS TFTs), LTPO-TFTs require lower driving power. LTPS products require 60 Hz power to display stationary images. However, a power requirement of LTPO products may be reduced to 1 Hz, which is much lower than the power requirement of the LTPS products. In LTPO products, part of LTPS TFTs is replaced by oxide semiconductor thin-film transistors (OS TFTs). Therefore, leakage current is reduced, enabling a voltage of capacitors to be held for one second, thereby driving 1 Hz. On the contrary, leakage current of the LTPS products is large. Furthermore, the LTPS products require 60 Hz power to display images even if the images are stationary. If the requirement power does not reach 60 Hz, brightness of the LTPS products will significantly decrease, but brightness of the LTPO products will not decrease. As a result, the LTPO products have become increasingly popular as they consume lower power.

Compared with the LTPS products, LTPO products require more layers when they are manufactured. In a process of manufacturing the OS TFTs, first the LTPS TFTs are manufactured, then indium gallium zinc oxides (IGZOs) are deposited on the LTPS TFTs by magnetron sputtering to form the OS TFTs. Nowadays, the LTPO products are commonly watches. To realize ultra-narrow bezels, a connection structure of a double-layer source/drain metal layer is usually disposed in a bending area. Specifically, in the bending area, a first source/drain layer, a second source/drain layer, and a gate electrode are connected many times, significantly increasing an electrical resistance of signal lines in the bending area. In addition, multiconnection results in poor contact.

Therefore, defects of conventional technologies are urgently to be addressed.

SUMMARY

The present disclosure provides an array substrate, a manufacturing method thereof, a display panel to solve following problems: in conventional structures, multiple layers of connection lines are required to realize electrical connection between signals at two sides of a bending area, leading to large electrical resistance of lines and poor contact of connection in the bending area.

To solve the above problem, technical solutions provided by the present disclosure are described as follows.

The present disclosure provides an array substrate, including a bending area and a non-bending area, wherein the array substrate further includes:

a substrate layer;

an inorganic stacked layer disposed on the substrate layer, wherein the inorganic stacked layer is provided with a recess in the bending area, the inorganic stacked layer is provided with a plurality of first metal lines in the non-bending area at two sides of the bending area;

a filling layer filled in the recess; and a second metal line disposed on the inorganic stacked layer and the filling layer, wherein the first metal lines and the second metal line form a lap joint at two sides of the bending area.

In the array substrate, a plurality of first thin-film transistors (TFTs) and a plurality of second TFTs are disposed on a part of the inorganic stacked layer corresponding to the non-bending area, a drain of the first TFTs is electrically connected to a source of the second TFTs, the first TFTs are low-temperature polycrystalline-silicon (LTPS) TFTs, and the second TFTs are oxide semiconductor (OS) TFTs.

In the array substrate, each of the first TFTs includes a first active layer, a first gate, a first electrode, and a first source/drain, which are stacked, each of the second TFTs includes a second electrode, a second active layer, a second gate, and a second source/drain, which are stacked, the first electrode and the second electrode are disposed on a same layer, and the first source/drain and the second source/drain are disposed on a same layer.

In the array substrate, the first metal lines, the first electrode, and the second electrode are disposed on a same layer, and the second metal line, the first source/drain, and the second source/drain are disposed on a same layer.

In the array substrate, the array substrate further includes a first planarization layer and a second planarization layer, which are stacked on the inorganic stacked layer, a third metal line is disposed on the first planarization layer, an anode is disposed on the second planarization layer, and the anode and the first source/drain form a lap joint by the third metal line.

In the array substrate, the inorganic stacked layer includes a buffer layer, a first gate insulating layer, a second gate insulating layer, a first dielectric layer, a third gate insulating layer, and a second dielectric layer, which are stacked.

The present disclosure further provides a method of manufacturing an array substrate, including following steps:

step S1, forming an inorganic stacked layer and a plurality of first metal lines on a substrate layer, wherein the substrate layer includes a bending area and a non-bending area, the first metal lines are disposed in the non-bending area at two sides of the bending area and are embedded in the inorganic stacked layer;

step S2, patterning the inorganic stacked layer to form a recess in the bending area and form a plurality of openings corresponding to the first metal lines;

step S3, filling the recess with a filling layer; and step S4, forming a source/drain metal layer on the inorganic stacked layer and the filling layer, and patterning the source/drain metal layer to form a second metal line in the bending area, wherein the second metal line and the first metal lines disposed at two sides of the bending area form a lap joint by the openings.

In the method, the step S1 includes following steps:

step 101, sequentially forming a first active layer, a first gate insulating layer, a first gate corresponding to the first active layer, and a second gate insulating layer on the substrate layer;

step 102, forming a first electrode layer on the second gate insulating layer, patterning the first electrode layer to form a first electrode corresponding to the first gate, a second electrode spaced apart from the first electrode, and the first metal lines disposed at two sides of the bending area; and step 103, sequentially forming a first dielectric layer, a second active layer corresponding to the second electrode, a third gate insulating layer, a second gate corresponding to the second active layer, and a second dielectric layer on the first electrode.

In the method, the step of patterning the inorganic stacked layer includes following steps:

step S201, etching the inorganic stacked layer for a first time to form a plurality of first openings corresponding to two ends of the second active layer and penetrating the second dielectric layer and the third gate insulating layer;

step S202, etching the inorganic stacked layer for a second time to form a plurality of second openings corresponding to the first metal lines and a plurality of third openings corresponding to two ends of the first active layer, wherein the second openings penetrate the second dielectric layer, the third gate insulating layer, and the first dielectric layer, and the third openings penetrate the second dielectric layer, the third gate insulating layer, the first dielectric layer, the second gate insulating layer, and the first gate insulating layer;

step S203, etching the inorganic stacked layer for a third time to form a fourth opening corresponding to the bending area and penetrating the second gate insulating layer, the first dielectric layer, the third gate insulating layer, and the second dielectric layer; and step S204, etching the inorganic stacked layer for a fourth time to form a fifth opening corresponding to the bending area and penetrating the buffer layer and the first gate insulating layer, wherein the fifth opening and the fourth opening are connected to each other to form the recess.

In the method, the step of patterning the source/drain metal layer includes a following step:

step S401, patterning the source/drain metal layer to form a first source/drain corresponding to the first active layer, a second source/drain corresponding to the second active layer, and a second metal line corresponding to the first metal lines, wherein the first source/drain is in contact with the first active layer by the third openings, the second source/drain is in contact with the second active layer by the first openings, and the second metal line is in contact with the first metal lines by the second openings.

The method further includes a following step:

step S5, forming a first planarization layer on the second metal line, patterning the first planarization layer to form a first through-hole corresponding to the first source/drain, forming a third metal layer on the first planarization layer, and patterning the third metal layer to form a third metal line electrically connected to the first source/drain.

The method further includes a following step:

step S6, forming a second planarization layer on the third metal line, patterning the second planarization layer to form a second through-hole corresponding to the third metal line, forming an anode layer on the second planarization layer, patterning the anode layer to form an anode electrically connected to the third metal line, forming a pixel defining layer on the anode, and patterning the pixel defining layer to form a pixel opening area corresponding to the anode.

The present disclosure further provides a display panel, including an array substrate. The array substrate includes a bending area and a non-bending area, and further includes:

a substrate layer;

an inorganic stacked layer disposed on the substrate layer, wherein the inorganic stacked layer is provided with a recess in the bending area, the inorganic stacked layer is provided with a plurality of first metal lines in the non-bending area at two sides of the bending area;

a filling layer filled in the recess; and a second metal line disposed on the inorganic stacked layer and the filling layer, wherein the first metal lines and the second metal line form a lap joint at two sides of the bending area.

In the display panel, a plurality of first thin-film transistors (TFTs) and a plurality of second TFTs are disposed on a part of the inorganic stacked layer corresponding to the non-bending area, a drain of the first TFTs is electrically connected to a source of the second TFTs, the first TFTs are low-temperature polycrystalline-silicon (LTPS) TFTs, and the second TFTs are oxide semiconductor (OS) TFTs.

In the display panel, each of the first TFTs includes a first active layer, a first gate, a first electrode, and a first source/drain, which are stacked, each of the second TFTs includes a second electrode, a second active layer, a second gate, and a second source/drain, which are stacked, the first electrode and the second electrode are disposed on a same layer, and the first source/drain and the second source/drain are disposed on a same layer.

In the display panel, the first metal lines, the first electrode, and the second electrode are disposed on a same layer, and the second metal line, the first source/drain, and the second source/drain are disposed on a same layer.

In the display panel, the array substrate further includes a first planarization layer and a second planarization layer, which are stacked on the inorganic stacked layer, a third metal line is disposed on the first planarization layer, an anode is disposed on the second planarization layer, and the anode and the first source/drain form a lap joint by the third metal line.

In the display panel, the inorganic stacked layer includes a buffer layer, a first gate insulating layer, a second gate insulating layer, a first dielectric layer, a third gate insulating layer, and a second dielectric layer, which are stacked.

Regarding the beneficial effects: in an array substrate, a manufacturing method thereof, and a display panel provided by the present disclosure, an electrical connection between signals at two sides of a bending area is realized by disposing only one layer of connection line in the bending area of the array substrate. Therefore, a following problem is solved: in conventional structures, multiple layers of connection lines are required to realize electrical connection between signals at two sides of a bending area, leading to large electrical resistance of lines and poor contact of connection in the bending area.

DESCRIPTION OF DRAWINGS

Technical solutions and beneficial effects of the present disclosure are illustrated below in detail in conjunction with drawings and specific embodiments.

FIG. 1 is a flowchart showing a manufacturing method of an array substrate according to an embodiment of the present disclosure.

FIGS. 2 to 10 are schematic flowcharts showing the manufacturing method of the array substrate according to the embodiment of the present disclosure.

DETAILED DESCRIPTION

Figure 3:
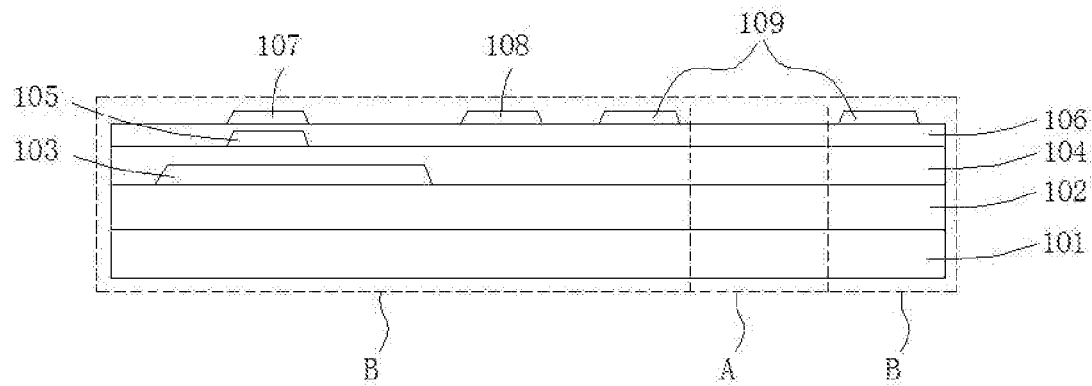

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified. In the present disclosure, "/" means "or".

Reference numbers and/or letters may be repeated in different examples of the present disclosure. Such repetitions are for simplification and clearness, which per se do not indicate the relations of the discussed embodiments and/or settings.

An array substrate, a manufacturing thereof, and a display panel of the present disclosure are illustrated below in detail with reference to specific embodiments.

As shown in FIG. 1, a flowchart showing a manufacturing method of an array substrate according to an embodiment of the present disclosure is provided. As shown in FIGS. 2 to 10, schematic flowcharts showing the manufacturing method of the array substrate according to the present embodiment of the present disclosure are provided. The manufacturing method includes following steps:

Step S1, forming an inorganic stacked layer and a plurality of first metal lines on a substrate layer, wherein the substrate layer includes a bending area and a non-bending area, the first metal lines are disposed in the non-bending area at two sides of the bending area and are embedded in the inorganic stacked layer.

Specifically, the step S1 includes following steps:

Step 101, sequentially forming a first active layer, a first gate insulating layer, a first gate corresponding to the first active layer, and a second gate insulating layer on the substrate layer.

As shown in FIG. 2, the substrate layer includes a flexible layer 101 and a buffer layer 102, which are stacked. The substrate layer includes a bending area A and a non-bending area B. An amorphous silicon layer is formed on the buffer layer 102, a polysilicon layer is formed by performing an annealing process on the amorphous silicon layer with laser, and the polysilicon layer is patterned to form a first active layer 103. Then, a first gate insulating layer 104 and a first metal layer are formed on an entire layer of the active layer 103, and the first metal layer is patterned to form a first gate 105 corresponding to the first active layer 103. After that, a second gate insulating layer 106 is disposed on an entire layer of the first gate 105.

Step 102, forming a first electrode layer on the second gate insulating layer, patterning the first electrode layer to form a first electrode corresponding to the first gate, a second electrode spaced apart from the first electrode, and the first metal lines disposed at two sides of the bending area.

As shown in FIG. 3, the first electrode layer is formed on the second gate insulating layer 106 and is patterned, thereby simultaneously forming the first electrode 107 corresponding to the first gate 105, the second electrode 108 spaced apart from the first electrode 107, and a plurality of first metal lines 109 disposed at two sides of the bending area A.

In one embodiment, a material of the first electrode layer and that of the first metal layer are same. For example, the material of the first electrode layer and that of the first metal layer may be a single metal layer or a multi-metal layer including at least one of Al, Pt, Pd, Ag, Mg, Au, Ni, Nd, Ir, Cr, Li, Ca, Mo, Ti, W, or Cu.

Step 103, sequentially forming a first dielectric layer, a second active layer corresponding to the second electrode, a third gate insulating layer, a second gate corresponding to the second active layer, and a second dielectric layer on the first electrode.

Figure 4:
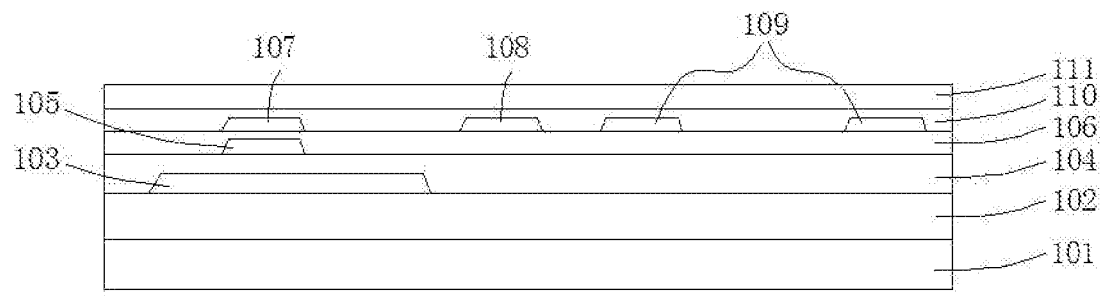

As shown in FIG. 4, a first dielectric layer 110 and an oxide semiconductor (OS) layer 111 are sequentially formed on the first electrode. The OS layer 111 is patterned to form a second active layer 112 corresponding to the second electrode 108.

Figure 5:
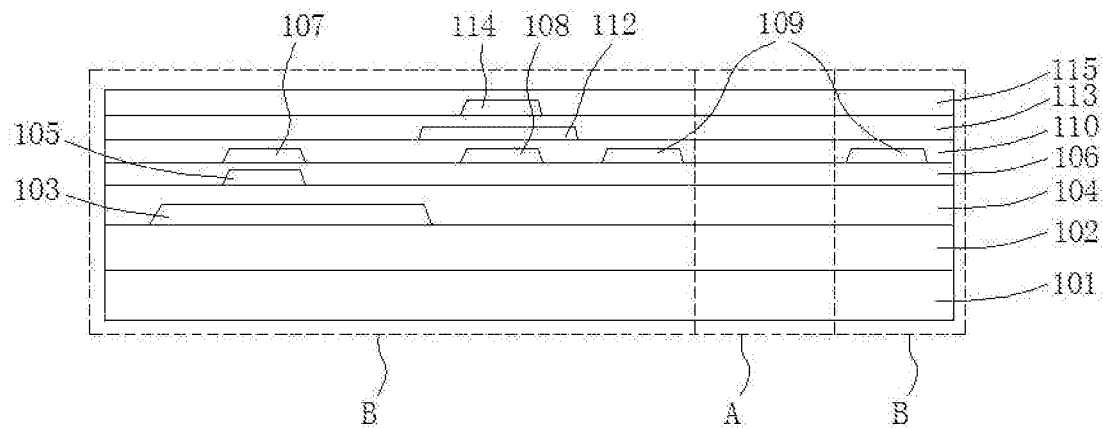

As shown in FIG. 5, a third gate insulating layer 113 and a second metal layer are sequentially formed on the second active layer 112. The second metal layer is patterned to form a second gate 114 corresponding to the second active layer 112. Then, a second dielectric layer 115 is formed on the second gate 114.

In one embodiment, a material of the second metal layer and that of the first metal layer are same.

The inorganic stacked layer includes the buffer layer 102, the first gate insulating layer 104, the second gate insulating layer 106, the first dielectric layer 110, the third gate insulating layer 113, and the second dielectric layer 115, which are stacked.

Step S2, patterning the inorganic stacked layer to form a recess in the bending area and form a plurality of openings corresponding to the first metal lines.

Figure 6:
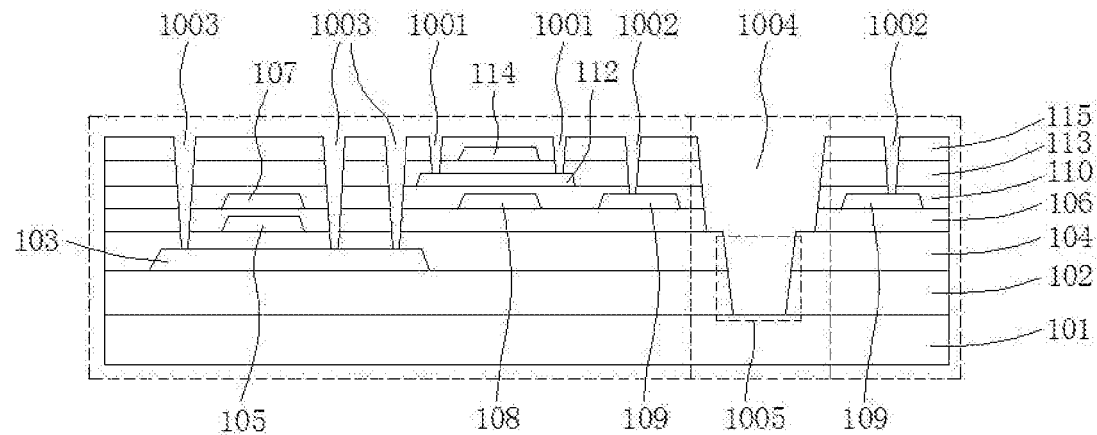

Specifically, as shown in FIG. 6, the inorganic stacked layer is patterned with a halftone mask, which includes following steps:

Step S201, etching the inorganic stacked layer for a first time to form a plurality of first openings 1001 corresponding to two ends of the second active layer 112 and penetrating the second dielectric layer 115 and the third gate insulating layer 113.

Step S202, etching the inorganic stacked layer for a second time to form a plurality of second openings 1002 corresponding to the first metal lines 109 and a plurality of third openings 1003 corresponding to two ends of the first active layer 103, wherein the second openings 1002 penetrate the second dielectric layer 115, the third gate insulating layer 113, and the first dielectric layer 110, and the third openings 1003 penetrate the second dielectric layer 115, the third gate insulating layer 113, the first dielectric layer 110, the second gate insulating layer 106, and the first gate insulating layer 104.

Step S203, etching the inorganic stacked layer for a third time to form a fourth opening 1004 corresponding to the bending area A and penetrating the second gate insulating layer 106, the first dielectric layer 110, the third gate insulating layer 113, and the second dielectric layer 115.

Step S204, etching the inorganic stacked layer for a fourth time to form a fifth opening 1005 corresponding to the bending area A and penetrating the buffer layer 102 and the first gate insulating layer 104, wherein the fifth opening 1005 and the fourth opening 1004 are connected to each other to form the recess.

Step S3, filling the recess with a filling layer.

Figure 7:
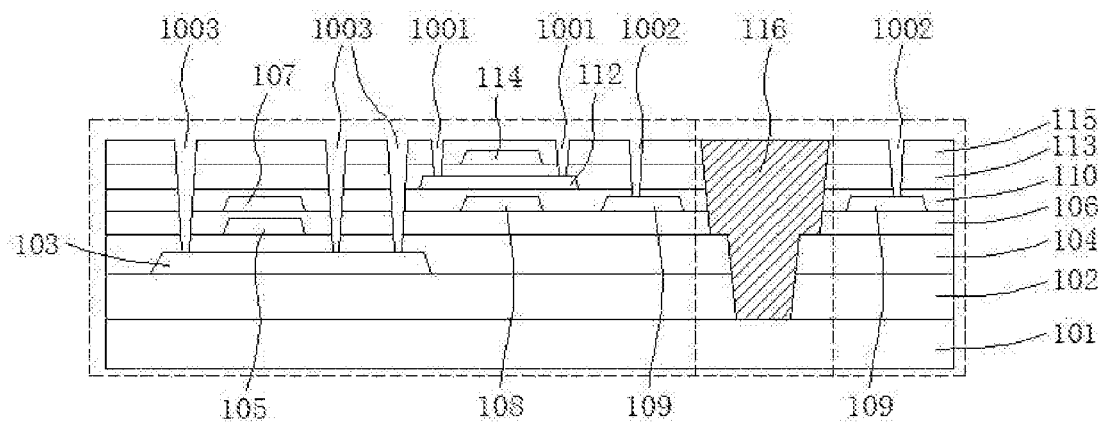

As shown in FIG. 7, the recess formed from the fifth opening 1005 and the fourth opening 1004 is filled with a filling layer 116 made of an organic material. Since a flexible layer made of an organic material is filled in a position where the inorganic stacked layer corresponding to the bending area A is removed, flexibility of the bending area A can be improved.

Step S4, forming a source/drain metal layer on the inorganic stacked layer and the filling layer, and patterning the source/drain metal layer to form a second metal line in the bending area, wherein the second metal line and the first metal lines disposed at two sides of the bending area form a lap joint by the openings.

Figure 8:
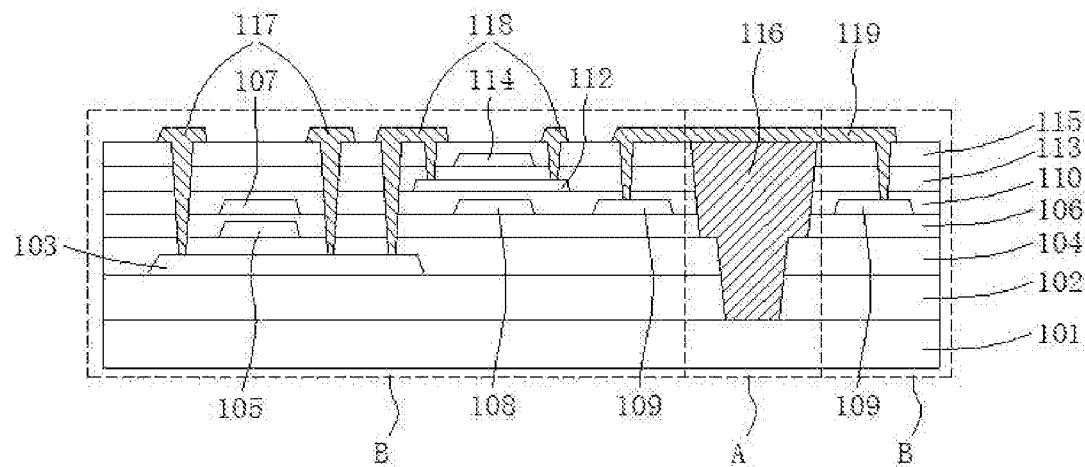

Specifically, as shown in FIG. 8, the step of patterning the source/drain metal layer includes a following step:

Step S401, patterning the source/drain metal layer to form a first source/drain 117 corresponding to the first active layer 103, a second source/drain 118 corresponding to the second active layer 112, and a second metal line 119 corresponding to the first metal lines 109, wherein the first source/drain 117 is in contact with the first active layer 103 by the third openings 1003, the second source/drain 118 is in contact with the second active layer 112 by the first openings 1001, and the second metal line 119 is in contact with the first metal lines 109 by the second openings 1002.

The first metal lines 109 and signal lines, such as data lines, are connected to each other in the non-bending area B. In the array substrate of the present disclosure, an electrical connection between signals at two sides of the bending area is realized by disposing only one layer of connection line (the second metal line 119) in the bending area. Therefore, a following problem is solved: in conventional structures, multiple layers of connection lines are required to realize electrical connection between signals at two sides of a bending area, leading to large electrical resistance of lines and poor contact of connection in the bending area.

Figure 9:
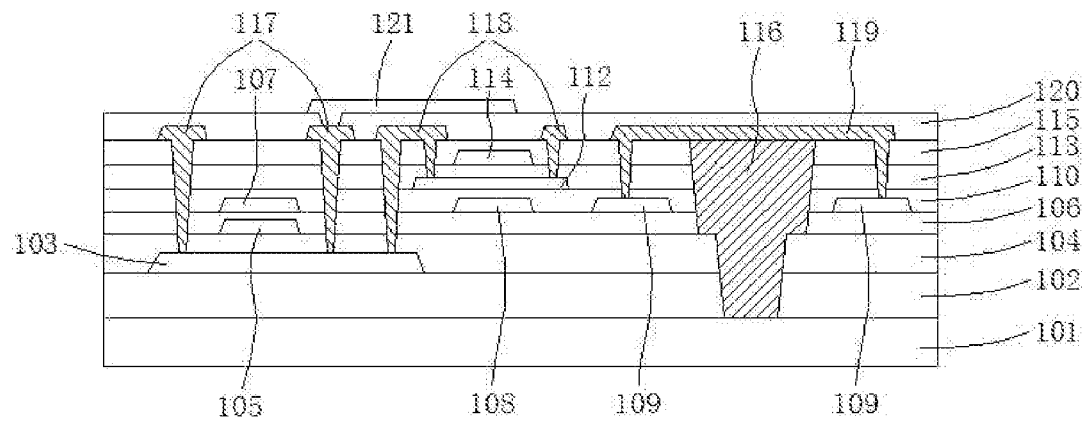

In another embodiment, after the step S4, the manufacturing method further includes a following step:

Step S5, as shown in FIG. 9, forming a first planarization layer 120 on the second metal line 119, patterning the first planarization layer 120 to form a first through-hole corresponding to the first source/drain 117, forming a third metal layer on the first planarization layer 120, and patterning the third metal layer to form a third metal line 121 electrically connected to the first source/drain 117.

A material of the third metal layer and that of the source/drain metal layer are same. For example, the material of the third metal layer and that of the source/drain metal layer may include Cu, Al, Ag, Mo, Cr, Nd, Ni, Mn, Ti, Ta, W, or any combination thereof. The third metal layer and the source/drain metal layer may have a single-layer structure or a multilayer structure. For example, the multilayer structure may be Cu/Mo, Ti/Cu/Ti, or Mo/Al/Mo.

Figure 10:
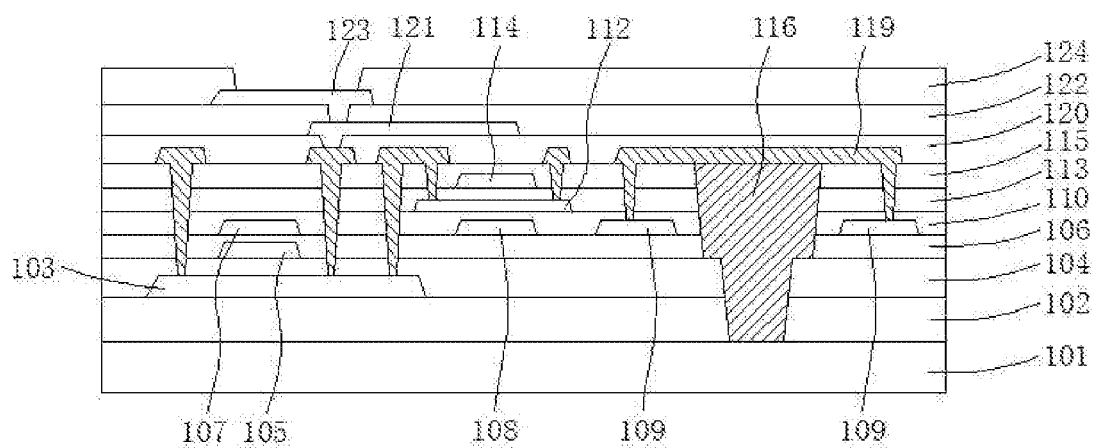
Figure 11:
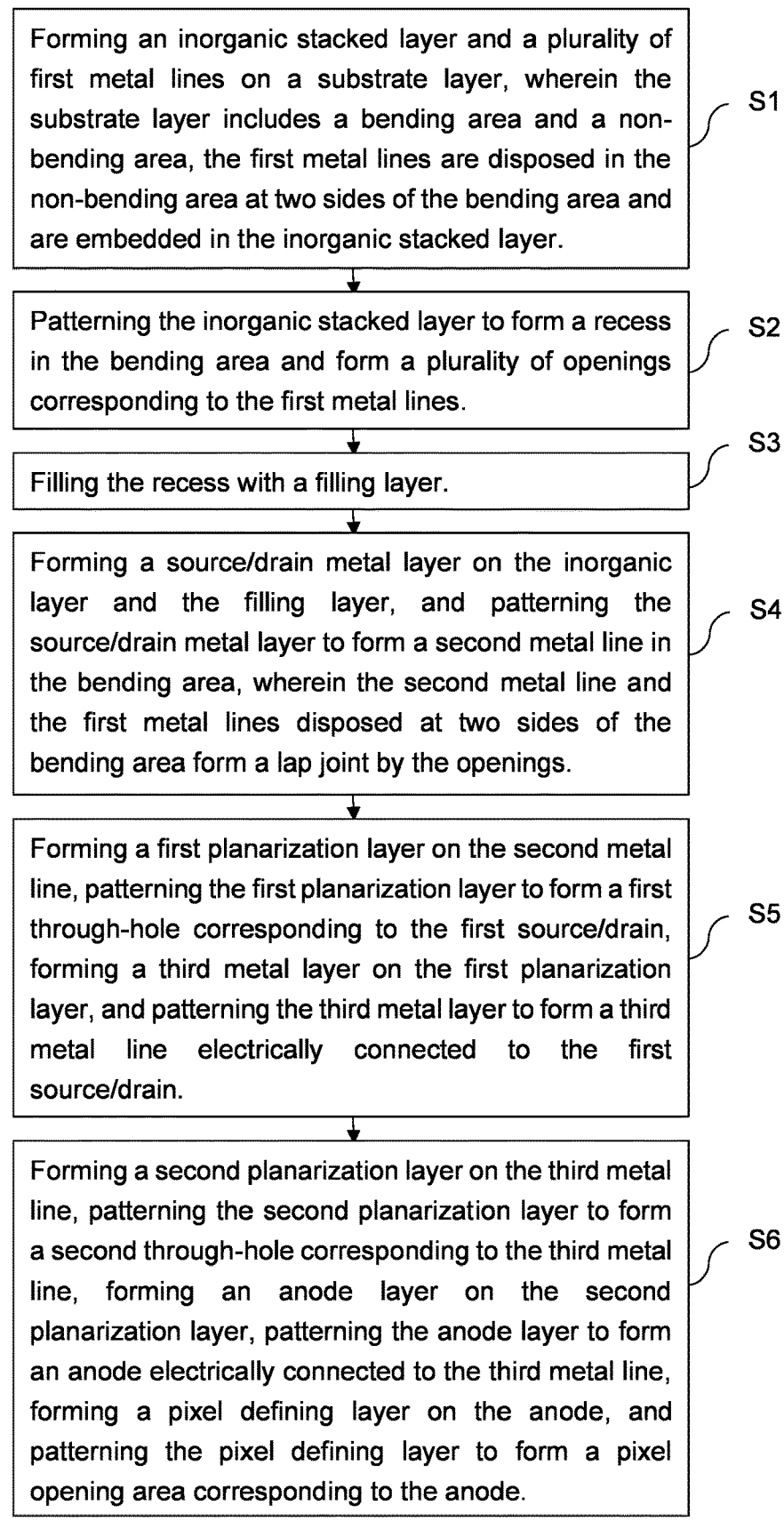
FIG. 11 is a schematic view showing a manufacturing method of an array substrate according to another embodiment of the present disclosure.

Step S6, as shown in FIG. 10, forming a second planarization layer 122 on the third metal line 121, patterning the second planarization layer 122 to form a second through-hole corresponding to the third metal line 121, forming an anode layer on the second planarization layer 122, patterning the anode layer to form an anode electrically connected to the third metal line 121, forming a pixel defining layer 124 on the anode 123, and patterning the pixel defining layer 124 to form a pixel opening area corresponding to the anode 123.

The present disclosure further provides an array substrate manufactured by the above manufacturing method. A structure of the array substrate is as shown in FIGS. 2 to 10. The array substrate includes a bending area A and a non-bending area B. The array substrate further includes: a substrate layer; an inorganic stacked layer disposed on the substrate layer, wherein a recess is defined on the inorganic stacked layer in the bending area A, a plurality of first metal lines 109 are disposed in the inorganic stacked layer in the non-bending area B at two sides of the bending area A; a filling layer 116 filled in the recess; and a second metal line 119 disposed on the inorganic stacked layer and the filling layer, wherein the first metal lines 109 at two sides of the bending area form a lap joint by the second metal line 119.

The substrate layer includes a flexible layer 101 and a buffer layer 102. The inorganic stacked layer includes the buffer layer 102, the first gate insulating layer 104, the second gate insulating layer 106, the first dielectric layer 110, the third gate insulating layer 113, and the second dielectric layer 115, which are stacked.

A plurality of first TFTs and a plurality of second TFTs are disposed on a part of the inorganic stacked layer corresponding to the non-bending area B. A drain of the first TFTs is electrically connected to a source of the second TFTs. The first TFTs are LTPS TFTs, and the second TFTs are OS TFTs.

Each of the first TFTs includes a first active layer 103, a first gate 105, a first electrode 107, and a first source/drain 117, which are stacked. Each of the second TFTs includes a second electrode 108, a second active layer 112, a second gate 114, and a second source/drain 118, which are stacked. The first electrode 107 and the second electrode 108 are disposed on a same layer, and the first source/drain 117 and the second source/drain 118 are disposed on a same layer.

The first metal lines 109, the first electrode 107, and the second electrode 108 are disposed on a same layer, and the second metal line 119, the first source/drain 117, and the second source/drain 118 are disposed on a same layer.

The array substrate further includes a first planarization layer 120 and a second planarization layer 122 stacked on the inorganic stacked layer. A third metal line 121 is disposed on the first planarization layer 120, an anode 123 is disposed on the second planarization layer 122, and the anode 123 and the first source/drain 117 form a lap joint by the third metal line 121.

The present disclosure further provides a display panel, including the above array substrate.

In an array substrate, a manufacturing method thereof, and a display panel provided by the present disclosure, an electrical connection between signals at two sides of a bending area is realized by disposing only one layer of connection line in the bending area of the array substrate. Therefore, a following problem is solved: in conventional structures, multiple layers of connection lines are required to realize electrical connection between signals at two sides of a bending area, leading to large electrical resistance of lines and poor contact of connection in the bending area.

To sum up, the present disclosure has been described with preferred embodiments thereof. The preferred embodiments are not intended to limit the present disclosure, and it is understood that many changes and modifications to the described embodiment can be carried out without departing from the scope and the spirit of the disclosure that is intended to be limited only by the appended claims.

What is claimed is:

1. A method of manufacturing an array substrate, comprising following steps:
    step S1, forming an inorganic stacked layer and a plurality of first metal lines on a substrate layer, wherein the substrate layer comprises a bending area and a non-bending area, the first metal lines are disposed in the non-bending area at two sides of the bending area and are embedded in the inorganic stacked layer;
    step S2, patterning the inorganic stacked layer to form a recess in the bending area;
    step S3, filling the recess with a filling layer; and
    step S4, forming a source/drain metal layer on the inorganic stacked layer and the filling layer, and patterning the source/drain metal layer to form a second metal line in the bending area, wherein the second metal line and the first metal lines disposed at the two sides of the bending area form a lap joint;
    wherein the step S1 comprises following steps:
        step 101, sequentially forming a first active layer, a first gate insulating layer, a first gate corresponding to the first active layer, and a second gate insulating layer on the substrate layer;
        step 102, forming a first electrode layer on the second gate insulating layer, patterning the first electrode layer to form a first electrode corresponding to the first gate, a second electrode spaced apart from the first electrode, and the first metal lines disposed at the two sides of the bending area; and
        step 103, sequentially forming a first dielectric layer, a second active layer corresponding to the second electrode, a third gate insulating layer, a second gate corresponding to the second active layer, and a second dielectric layer on the first electrode;
    wherein the inorganic stacked layer comprises a buffer layer, the first gate insulating layer, the second gate insulating layer, the first dielectric layer, the third gate insulating layer, and the second dielectric layer, which are stacked;
    wherein the step of patterning the inorganic stacked layer comprises following steps:
        step S201, etching the inorganic stacked layer for a first time to form a plurality of first openings corresponding to two ends of the second active layer and penetrating the second dielectric layer and the third gate insulating layer;
        step S202, etching the inorganic stacked layer for a second time to form a plurality of second openings corresponding to the first metal lines and a plurality of third openings corresponding to two ends of the first active layer, wherein the second openings penetrate the second dielectric layer, the third gate insulating layer, and the first dielectric layer, and the third openings penetrate the second dielectric layer, the third gate insulating layer, the first dielectric layer, the second gate insulating layer, and the first gate insulating layer;
        step S203, etching the inorganic stacked layer for a third time to form a fourth opening corresponding to the bending area and penetrating the second gate insulating layer, the first dielectric layer, the third gate insulating layer, and the second dielectric layer; and
        step S204, etching the inorganic stacked layer for a fourth time to form a fifth opening corresponding to the bending area and penetrating the buffer layer and the first gate insulating layer, wherein the fifth opening and the fourth opening are connected to each other to form the recess.

2. The method of claim 1, wherein the step of patterning the source/drain metal layer comprises a following step:
    step S401, patterning the source/drain metal layer to form a first source/drain corresponding to the first active layer, a second source/drain corresponding to the second active layer, and the second metal line corresponding to the first metal lines, wherein the first source/drain is in contact with the first active layer by the third openings, the second source/drain is in contact with the second active layer by the first openings, and the second metal line is in contact with the first metal lines by the second openings.

3. The method of claim 2, further comprising a following step:
    step S5, forming a first planarization layer on the second metal line, patterning the first planarization layer to form a first through-hole corresponding to the first source/drain, forming a third metal layer on the first planarization layer, and patterning the third metal layer to form a third metal line electrically connected to the first source/drain.

4. The method of claim 3, further comprising a following step:
    step S6, forming a second planarization layer on the third metal line, patterning the second planarization layer to form a second through-hole corresponding to the third metal line, forming an anode layer on the second planarization layer, patterning the anode layer to form an anode electrically connected to the third metal line, forming a pixel defining layer on the anode, and patterning the pixel defining layer to form a pixel opening area corresponding to the anode.

* * * * *